(12) United States Patent
Ishikawa et al.

(10) Patent No.: US 6,179,922 B1
(45) Date of Patent: Jan. 30, 2001

(54) CVD PHOTO RESIST DEPOSITION

(75) Inventors: Akira Ishikawa, Plano, TX (US); Tadao Ohkusa, Chiba (JP)

(73) Assignee: Ball Semiconductor, Inc., Allen, TX (US)

(*) Notice: Under 35 U.S.C. 154(b), the term of this patent shall be extended for 0 days.

(21) Appl. No.: 09/351,202

(22) Filed: Jul. 9, 1999

Related U.S. Application Data

(60) Provisional application No. 60/092,388, filed on Jul. 10, 1998.

(51) Int. Cl.$^7$ .................................................. C23C 16/00
(52) U.S. Cl. ...................... 118/716; 118/715; 118/718; 118/725
(58) Field of Search .................... 118/716, 718, 118/715, 724, 725

(56) References Cited

U.S. PATENT DOCUMENTS

| | | | |
|---|---|---|---|
| 2,847,319 | * 8/1958 | Marvin | 118/716 |
| 3,190,262 | * 6/1965 | Bakish et al. | 118/718 |
| 3,572,286 | * 3/1971 | Forney | 118/718 |
| 3,969,163 | * 7/1976 | Wakefield | 148/174 |
| 4,395,481 | 7/1983 | Birkle et al. | 430/326 |
| 4,547,395 | 10/1985 | Hall et al. | 427/54.1 |
| 4,675,273 | 6/1987 | Woods et al. | 430/325 |
| 5,462,639 | 10/1995 | Matthews et al. | 156/662.1 |
| 5,536,324 | * 7/1996 | Fuchita | 118/726 |
| 5,683,516 | * 11/1997 | Dedontney et al. | 118/718 |
| 5,925,494 | 7/1999 | Horn | 430/270.1 |
| 5,955,776 | 9/1999 | Ishikawa | 257/618 |

FOREIGN PATENT DOCUMENTS

| | | |
|---|---|---|
| 36123245OA | 10/1986 | (JP) . |
| 2-119241 | 10/1988 | (JP) . |

* cited by examiner

*Primary Examiner*—Jeffrie R. Lund
(74) *Attorney, Agent, or Firm*—Haynes and Boone, LLP

(57) ABSTRACT

A system for depositing photo resist using chemical vapor deposition ("CVD") onto a semiconductor substrate is disclosed. The system includes a processing chamber and a gas chamber. The gas chamber receives a monomer and supplies sufficient energy for polymerization of the monomer, thereby creating a polymer vapor. The processing chamber receives the semiconductor substrate and the polymer vapor. CVD occurs and the polymer vapor deposits a thin layer photo resist on the surface semiconductor substrate.

9 Claims, 2 Drawing Sheets

CVD PHOTO RESIST DEPOSITION

CROSS REFERENCE

This patent claims the benefit of U.S. Ser. No. 60/092,388 filed Jul. 10, 1998.

BACKGROUND OF THE INVENTION

The invention relates generally to semiconductor integrated circuits, and more particularly, to an apparatus and method for fabricating photo sensitive material onto a surface of a semiconductor integrated circuit, such as a spherical-shaped semiconductor device.

Conventional integrated circuit devices, or "chips," are formed from a flat surface semiconductor wafer. The semiconductor wafer is first manufactured in a semiconductor material manufacturing facility and is then provided to a fabrication facility. At the latter facility, several processing operations are performed on the semiconductor wafer surface. One such process is applying photo resist to the wafer to print integrated circuit patterns on the wafer's surface.

Traditionally, photo resist is made of one or more polymers and solvent by an off-site manufacturer. The photo resist is provided in liquid form to the fabrication facility for coating on the wafer surface. The resist is then dispensed onto a static or slowly rotating wafer and the wafer is spun rapidly to cover the wafers surface with an even, thin coating of the resist. Once covered, the resist is dried to remove any solvents and is available for any subsequent etch processing.

Photo resist is used to produce an "image" on the wafer surface. The image is responsive to light, so that where the light strikes, the resist becomes polymerized and more difficult to remove (i.e., the resist is developed). The non-polymerized regions may then be removed with etchants, including any layers under the non-polymerized regions. As a result, mask patterns can be placed on the wafer surface and used to create underlying circuit patterns in the semiconductor substrate.

The main requirements for resist application are that the resist be pinhole-free and of uniform and reproducible thickness. Very tight layers of resist are also generally required. However, the use of thin layers of resist requires much more attention be given to the removal of particles and gelatinous masses from the resist before it is dispensed.

There are many problems associated with conventional resist applications. For example, resist quality has a short life-span because it is difficult to maintain the solvents in liquid form in a normal environment. Solvents are used to maintain the liquid form, but must be efficiently removed during processing. Also, it is difficult to coat the photo resist on the wafer with a uniform thickness. Furthermore, although resist is filtered by the manufacturer, subsequent contamination may occur and long storage times produce more gel. To resolve this, the resist is often re-filtered just before application. What is needed is a system for applying photo resist to a substrate that does not experience the quality deterioration and maintenance difficulties associated with conventional resist applications.

In a continuing effort to provide an all-dry lithographic process, both dry application and dry developing of the resist are desired. Thus far, no production-worthy success has been achieved with dry resist application, and no production-worthy plasma-developable resists currently exist. What is needed is a system that facilitates the dry application and dry developing of photo resist.

Another problem with conventional photo resist applications is that they only work with relatively flat, wafer-shaped substrates. In U.S. Pat. No. 5,955,776 filed on May 16, 1997, a method and apparatus for manufacturing an integrated circuit on a spherical-shaped semiconductor is disclosed. Inherently, the technique of applying photo resist to a portion of a spherical shaped substrate and then spinning the substrate to spread the resist does not work well. Therefore, what is needed is a system that can apply the photo resist to various shaped substrates, such as a spherical-shaped semiconductor substrate.

SUMMARY

In response to the aforementioned problems, an improved chemical vapor deposition ("CVD") photo resist and deposition system onto a semiconductor substrate is provided. In one embodiment, the system includes a processing chamber and a connected gas chamber. The gas chamber receives a monomer and supplies sufficient energy for polymerization of the monomer, thereby creating a polymer vapor. The processing chamber receives the semiconductor substrate and the polymer vapor. CVD is then performed in the processing chamber so that the polymer vapor deposits a thin layer of photo resist on the surface of the semiconductor substrate.

In some embodiments, a heater is connected to the gas chamber for facilitating the polymerization of the monomer. The heater may also facilitate the application of the polymer vapor onto the semiconductor substrate.

In some embodiments, the processing chamber includes an inlet and an outlet diametrically opposed to each other. In this way, the semiconductor substrate can move through the processing chamber and have the photo resist applied during the movement. This works well with substrates that are substantially spherical in shape.

In some embodiments, an inert carrier gas is also used with the system. The carrier gas may be used to facilitate the movement of the monomer in the gas chamber and/or to provide heat in the gas chamber to facilitate a rate of polymerization.

In another embodiment, the system includes a processing chamber and a heater. The processing chamber is for receiving the semiconductor substrate and the monomer. The heater surrounds and heats an interior of the processing chamber so that the heated processing chamber can convert the monomer into a polymer vapor. The polymer vapor will then deposit a thin film of photo resist about the semiconductor substrate's surface.

In some embodiments, both the monomer and the polymer vapor may be deposited on the semiconductor substrate. However, the deposited monomer subsequently polymerizes.

In some embodiments, the heater serves to harden the deposited polymer vapor.

In some embodiments, the semiconductor substrate is one of a sequence of similar shaped semiconductor substrates being sequentially provided to the processing chamber. The similar shape may be spherical or otherwise.

DESCRIPTION OF THE PREFERRED EMBODIMENTS

Figure 1:
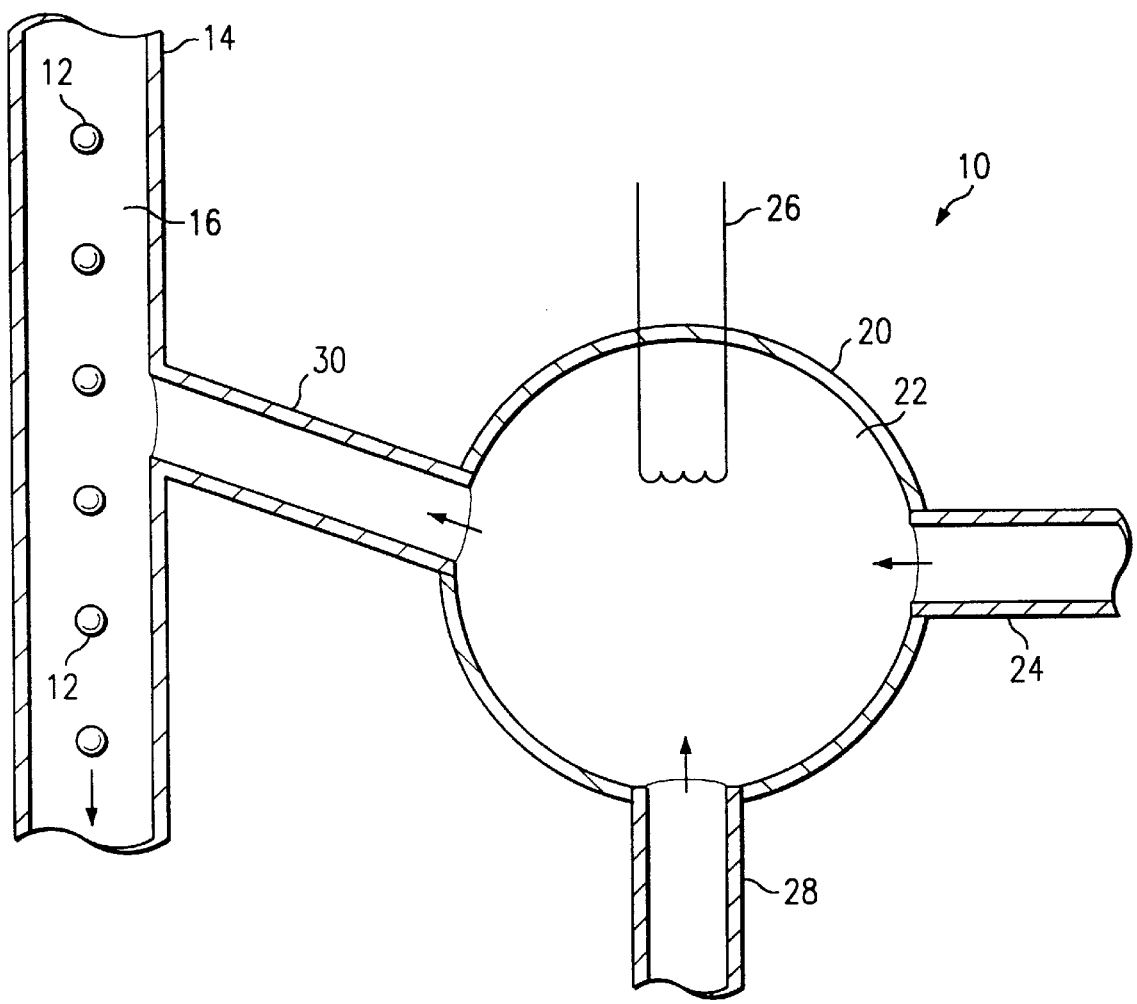
FIG. 1 illustrates a system and method for polymerizing and depositing photo resist onto a spherical shaped integrated circuit device according to one embodiment of the invention.

Referring to FIG. 1, the reference numeral 10 designates, in general, a system for fabricating photo sensitive material onto a surface of a semiconductor substrate, such as a semiconductor integrated circuit device 12. The system 10 makes a polymer and then deposits the polymer on the device 12. For the sake of example, the device 12 could be spherical-shaped according to the technique disclosed in the above-identified U.S. Pat. No. 5,955,766.

The device 12 moves through a processing tube 14 with a carrier gas (not shown). In some embodiments, the device 12 moves downward (with gravity), while in other embodiments, the carrier gas suspends or lifts the device as needed. The processing tube 14 defines a first chamber 16 in which chemical vapor deposition ("CVD") may occur. Although not shown, prior to the first chamber 16, the device may go through a pre-bake cycle to promote good adhesion with the resist. Also, a promoter such as hexamethyldisilizane in xylene may be applied to the device to further promote adhesion. Phosphorus, carbonyl, or sulfur-containing additives may be provided with the promoter, as required.

An adjacent enclosure 20 defines a second chamber 22. A monomer such as methyl methacrylate ("MMA") is injected into the second chamber 22 through a gas inlet 24. Although not shown, the monomer may be combined with an inert carrier gas to facilitate its movement. A heater 26 heats the interior of the second chamber 22 so that the monomer is polymerized as a polymer such as polymethyl methacrylate ("PMMA"). Although the heater 26 is illustrated as an electric coil, it is understood that many different methods may be employed. The heater 26 may be further facilitated by heated gas from gas inlet 28. The rate of polymerization can also be controlled by the heated gas and the heater 26 temperature.

It is important to have an appropriate resist viscosity, including both dynamic viscosity and kinematic viscosity. Dynamic viscosity is defined as the shearing stress of the polymer, divided by the rate of shearing strain. It is measured in the units of poise. Kinematic viscosity is defined as the dynamic viscosity divided by the density of the polymer. Kinematic viscosity is measured in the units of stokes. Since the density of the polymer is relatively insensitive to solids content, the ratio of kinematic to dynamic viscosity remains relatively constant.

A specific amount of the polymer is then fed into the first chamber 16 through a connecting tube 30. As a result, the first chamber 16 provides a CVD zone. The polymer vapor may then deposit a thin film of photo resist on the surface of the devices 12. Film thickness on the devices 12 is very uniform, and can be controlled by such things as temperature and rate of movement of each device through the first chamber 16. Also, the devices 12 can be spun inside the first chamber 16 to facilitate the application of the polymer vapor.

The application provides a resist coating that is relatively pinhole-free and of uniform and reproducible thickness. Also, because there is little to no storage time of the polymer, gelatinous masses from the resist are significantly reduced.

Conventionally, the thickness of a liquid resist coating is a function of the angular velocity of a spinning wafer and the amount of time it is spinning. However, these variables do not translate into parameters for three dimensional substrates. Whereas a discrete amount of liquid resist may be applied to the central portion of the flat wafer and then spun to its outer portions, such spinning will not effectively spread the resist on the spherical shaped device 12. Therefore, the polymer vapor deposition of the present invention applies photo resist evenly across the entire device 12. Also, if the device 12 is indeed spinning, the application of the polymer vapor on the device becomes even more uniform. It is understood, however, that a spinning device 12 is not used to spread the applied polymer vapor across the device surface. As a result, the system 10 works well with various shaped substrates.

Figure 2:
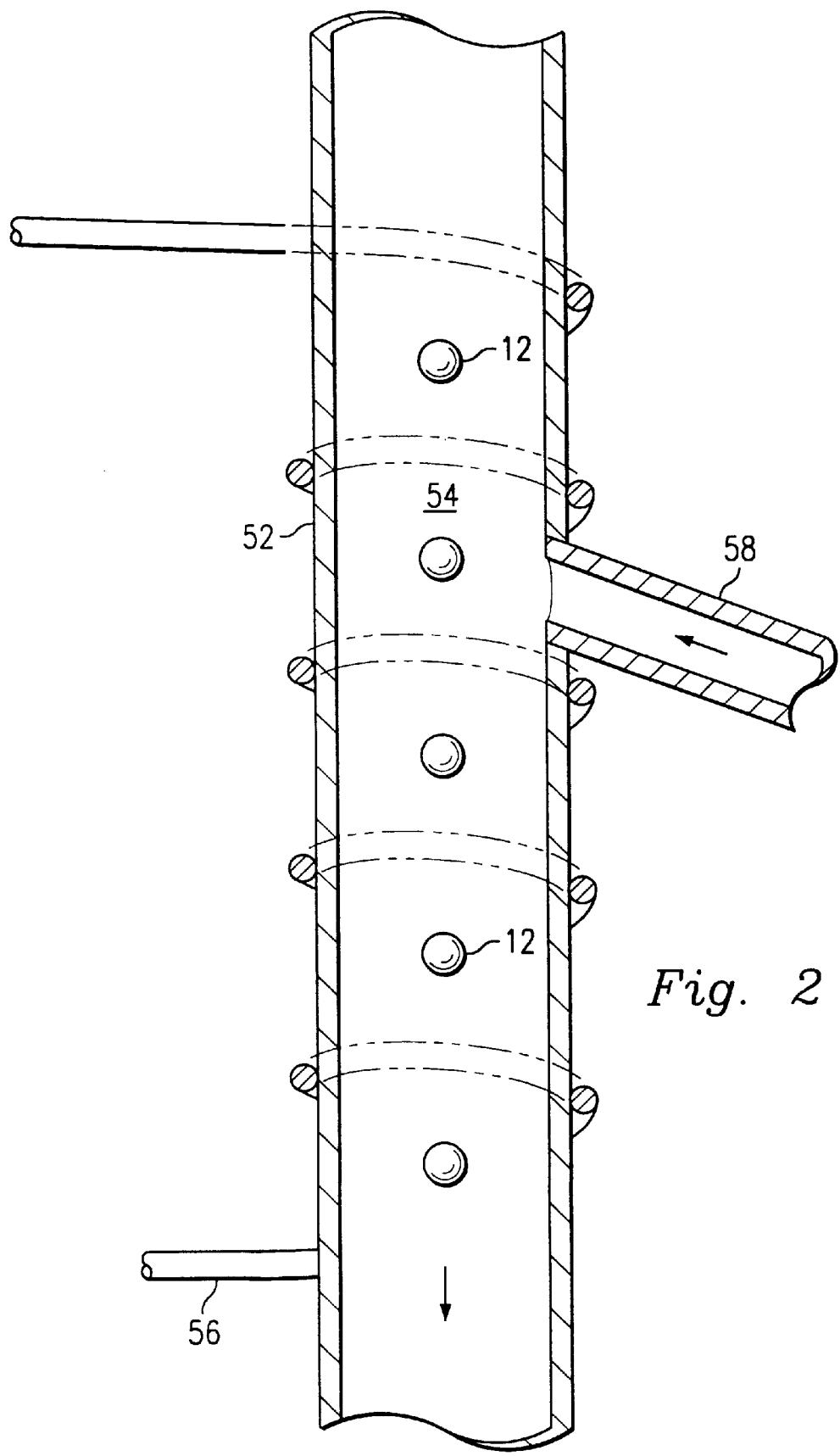
FIG. 2 illustrates a system and method for depositing and polymerizing photo resist onto a spherical shaped integrated circuit device according to another embodiment of the invention.

FIG. 2, the refers to another system for fabricating photo sensitive material onto the surface of the device 12. The device 12 moves through a processing tube 52 with a carrier gas (not shown). In some embodiments, the device 12 moves downward (with gravity), while in other embodiments, the carrier gas suspends or lifts the device as needed. The processing tube 52 defines a chamber 54 in which monomer and/or polymer deposition may occur.

The chamber 54 is heated by a heater 56, graphically represented as a heater coil. Monomer gas is fed through inlet pipe 58 into the chamber 54. The monomer gas is polymerized by energy from the heater 56. Both monomer and polymer may actually deposit on the devices 12, but a significant portion of the deposited monomer eventually polymerizes. The resulting resist film is very uniform, despite the three dimensional nature of the device. Furthermore, thickness can be controlled by such things as temperature and rate of movement of the device 12 through the chamber 54.

The heating of the chamber 54 may also serve to facilitate the resist application on the devices 12. For example, the heating of the chamber 54 can harden the resist and thereby improve adhesion.

A benefit of the present invention is that photo resist is deposited under a chemical vapor environment, instead of the liquid phase processing of conventional technology.

Another benefit of the present invention is that the quality problems associated with liquid resist, such as those due to solvents and those associated with refrigeration, are reduced.

Yet another benefit of the present invention is that it provides a film of resist with a uniform thickness. The thickness can be very thin.

Yet another benefit of the present invention is that it works well with nonplanar substrates.

Yet another benefit of the present invention is that it works well with a pipe-line process.

Yet another benefit of the present invention is that it reduces the introduction of particles in the resist application.

It is understood that several variations may be made in the foregoing. For example, flat materials, such as chips, can be processed in the corresponding chambers by being physically paced in the chamber. Further, the above described systems may be used to deposit different kinds of resist, including positive or negative resist and organic or inorganic resists. Additional modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A system for applying photo resist to a semiconductor substrate, the system comprising:

a processing chamber for receiving the semiconductor substrate;

means for containing the semiconductor substrate in a non-contact manner inside the processing chamber;

a gas chamber for receiving a monomer and polymerizing the monomer into a polymer vapor; and means connecting the gas chamber to the processing chamber so that the polymer vapor can be applied directly to the semiconductor substrate, thereby depositing the photo resist onto an outer surface of the semiconductor substrate.

2. The system of claim 1 further comprising:

a heater connected to the gas chamber for facilitating the polymerization of the monomer.

3. The system of claim 1 further comprising:

a heater connected to the processing chamber for facilitating the application of the polymer vapor to the semiconductor substrate.

4. The system of claim 1 wherein the means for containing includes an inlet and an outlet connected to the processing chamber and diametrically opposed to each other, so that the semiconductor substrate can move through the processing chamber without contact and have the photo resist applied over its entire outer surface during the movement.

5. The system of claim 4 wherein the semiconductor substrate is spherically shaped.

6. The system of claim 1 wherein the gas chamber includes a first inlet for receiving the monomer and an inert carrier gas, the carrier gas being used to facilitate the movement of the monomer in the gas chamber.

7. The system of claim 6 wherein the gas chamber includes a second inlet for receiving a heating gas, the heating gas being used to facilitate a rate of polymerization.

8. The system of claim 1 further comprising:

a heater connected to the gas chamber for facilitating the creation of the processing vapor.

9. A system for processing a three-dimensional substrate, the system comprising:

a processing chamber for receiving the substrate;

means for containing the substrate without contact inside the processing chamber;

a gas chamber for creating a processing vapor; and means connecting the gas chamber to the processing chamber so that the processing vapor can be applied directly to the three-dimensional substrate.

* * * * *